United States Patent [19]
Polese et al.

[11] Patent Number: 6,096,111
[45] Date of Patent: Aug. 1, 2000

[54] EXOTHERMICALLY SINTERED HOMOGENEOUS COMPOSITE AND FABRICATION METHOD

[75] Inventors: Frank J. Polese, 10103 Carroll Canyon Rd., San Diego, Calif. 92131; Ranganath Saraswati, San Diego, Calif.

[73] Assignee: Frank J. Polese, San Diego, Calif.

[21] Appl. No.: 09/080,974

[22] Filed: May 19, 1998

[51] Int. Cl.$^7$ ........................................ B22F 3/12
[52] U.S. Cl. .................. 75/228; 75/235; 75/236; 75/247; 75/249; 419/12; 419/13; 419/14; 419/19; 419/45; 419/47
[58] Field of Search ...................... 419/2, 12–14, 419/19, 45, 97; 75/247, 249, 228, 235, 236

[56] References Cited

U.S. PATENT DOCUMENTS

| | | | |
|---|---|---|---|
| 4,954,170 | 9/1990 | Fey et al. | 75/229 |
| 4,961,778 | 10/1990 | Pyzik et al. | 75/230 |
| 5,413,751 | 5/1995 | Polese et al. | 419/23 |

*Primary Examiner*—Ngoclan Mai
*Attorney, Agent, or Firm*—Henri J.A. Charmasson; John D. Buchaca

[57] ABSTRACT

A homogeneous sintered composite made by press-forming a homogeneous mixture of powders of an agglutinating component, a second component having a melting point higher then the agglutinating component, and an exothermically reactive component to form a compact; heating the compact, then inducing an exothermic reaction of the reactive substance which generates sufficient additional heat to melt the agglutinating component without melting the high melting point component. For electronic microcircuit heat-dissipation applications the agglutinating component is a high thermal conductivity metal, and the high melting point component has a low thermal expansivity, whose proportions are adjusted to match the thermal expansion characteristics of microcircuit material. To reduce porosity, the reacted compact is pressed again while the agglutinating component is still in the liquid phase. For low weight applications the second material has high specific thermal conductivity. For filtration media applications, the reacted compact is allowed to cool with or without pressing, leaving a porous final composite. For corrosion resistant media, the agglutinating component is a low refractory metal, and the second material is a refractory metal oxide, carbide or boride.

20 Claims, No Drawings

EXOTHERMICALLY SINTERED HOMOGENEOUS COMPOSITE AND FABRICATION METHOD

FIELD OF THE INVENTION

The instant invention relates to powder metallurgy, and more specifically to the manufacture of homogeneously sintered composites, including heat-dissipating structures having a coefficient of thermal expansion compatible with the material used in the fabrication of microcircuits, and to the manufacture of corrosion resistant fluid filtration media, mechanical parts requiring transpirational cooling, and tissue connectable surgical implants.

BACKGROUND OF THE INVENTION

The fabrication of electronic microcircuit components requires the use of structures such as heatsinks which are capable of dissipating the heat generated by the active parts of the microcircuit or by the soldering, brazing or glass-sealing process. Moreover, those structures that are in direct contact with the active microcircuit sections must have a coefficient of thermal expansion compatible with silicon, germanium, gallium arsenide, alumina or any material used in the fabrication of the microcircuit or their enclosures. Otherwise, stresses caused by the disproportionate expansion may damage components.

The coefficient of thermal expansion of a material is defined as the ratio of the change in length per degree Celsius to the length at 25° C. It is usually given as an average value over a range of temperatures. The thermal conductivity of a material is defined as the time rate of heat transfer through unit thickness, across unit area, for a unit difference in temperature or $K=WL/AT$ where W=watts, L=thickness in meters, a=area in square meters, and T=temperature difference in ° K or ° C.

Materials such as copper, silver, gold and aluminum which exhibit high coefficients of heat dissipation tend also to have coefficients of expansion much higher than typical microcircuit materials. For copper, K is equal to 398 W/m° K whereas its coefficient of thermal expansion is about $16 \times 10^{-6}/°$ C. For silver, K is equal to 427 W/m° K and its coefficient of thermal expansion is about $19 \times 10^{-6}/°$ C. By contrast, material such as gallium arsenide and silicon have an average coefficient of thermal expansion of less than $7 \times 10^{-6}/°$ C.

As disclosed in U.S. Pat. No. 4,680,618 Kuroda et al., it has been found convenient to use composites of copper and other low CTE metals such as tungsten or molybdenum in the fabrication of heatsinks and other heat-dissipating elements of microcircuits. Tungsten and molybdenum with average coefficient of thermal expansion of $4.5 \times 10^{-6}/°$ C. and $4.8 \times 10^{-6}/°$ C. and thermal conductivity of 178 and 138 W/m° K respectively. The proportions of the metals in the composite are designed to adjust its overall coefficient of thermal expansion to be compatible with the material in the microcircuit component.

However, while copper, aluminum, and silver have specific gravities of less than 9, and melting points of less than 1,100° C., tungsten and molybdenum have specific gravities of 19.3 and 10.2, and melting points of 3,370° C. and 2,630° C. respectively. Because of these large differences in the specific gravities and melting-points, and lack of mutual solubility of metals such as copper and tungsten, it is difficult to form composites of those two metals that exhibit a reliable degree of homogeneity using conventional melting processes.

One solution in which molten copper is infiltrated into a porous sintered compact of tungsten, as disclosed in Osada, et al. U.S. Pat. No. 5,086,333, consumes large amounts of energy and is therefore expensive. Another solution involves preclustering particles of both metals, then pressing and sintering the low melting point metal as disclosed in Polese et al., U.S. Pat. No. 5,413,751. However, it is difficult to predict or devise the optimum heating schedule for sintering the low melting point component in variously shaped and sized structures. Often times certain peripheral portions of the compact reach the sintering temperature before the deeper internal portions since heat is transferred from the outer portions to the inner. Prolonged exposure of the outer portion to these temperatures tend to reduce homogeneity.

Additionally, use of these dense metals increases the overall weight of the structures. In many applications such as in aerospace systems, lighter weight structures are preferable. Therefore, those materials having a high thermal conductivity and low density are desirable. In other words, for low-weight microcircuit applications, preferred microcircuit heat-dissipating materials will exhibit a high specific thermal conductivity, expressed by the ratio of its thermal conductivity coefficient and its specific gravity, or K divided by its density.

Although aluminum is light weight and has a high thermal conductivity, it has a very low melting point (about 660° C.) and very high thermal expansivity (about $23.1 \times 10^{-6}/°$ C.). Prior composites of aluminum therefore suffer from expansivity problems. In addition, these composites are not readily brazable using relatively high-heat brazing techniques popular in the field such as CuSiL brazing which uses temperatures around 830° C. Even short duration exposure to such temperatures will cause reflow of the aluminum out of the composite, reducing homogeneity and hence the composite's CTE compatibility. Also, the thermal conductivity of aluminum (about 237 W/m° K) is significantly lower than that of copper (about 398 W/m° K).

It would be advantageous therefore, to have a simpler and more practical process to manufacture homogeneous sintered composites using powder metallurgy techniques, and to devise a lighter weight, brazable, heat-dissipating material.

Porous metals have also been used as filtration media for separating solid contaminants from a liquid or gaseous stream. Metal filters enjoy several advantages over filters made from other media such as organic felt or paper depending on the application. Metal filters in general withstand higher temperatures and fluid volumes and pressures.

Porous metal filters have been used in many varying applications including petroleum refining, pharmaceutical, food, and beverage preparation, textile manufacturing and other chemical processing industries. In cryogenic applications, liquefied gasses such as oxygen, nitrogen, and helium are filtered. Porous stainless steel and MONEL brand nickel alloy metal have been used to filter molten uranium compounds in nuclear applications. Sintered bronze filters separate water from air in pneumatic systems via differences in surface tension.

In other filtration applications porous metals have been used as containment structures for other filtration media as in the membrane support in reverse osmosis filters and dialysis machines.

Porous metals are also useful for other applications apart from filtration such as in the fabrication of parts requiring transpirational cooling such as gas turbine and rocket engine parts, and even the nose tips of missiles. Porous metals have also been used to provide a base for tissue attachment in surgical implants.

The fabrication steps for creating the porous metal filtration media or other parts depends greatly on the application and the metals used. For example bronze filters are usually made by gravity sintering spherical bronze powders. The resulting properties of the filter depend on the particle size and porosity of the powder. Producing filters with the highest permeability for a given maximum pore size usually requires uniform size particles.

For stainless steel filter sheets, steel powder is mixed with resin, spread, then lightly pressed at a temperature that cures the resin. The sheet is then sintered decomposing the resin, then further densified by one or more pressings and/or sinterings. Porous hollow steel cylinders may also be formed by cold isostatic pressing.

In corrosive or high-heat applications other metals such as nickel-based alloys such as MONEL brand, INCONEL brand and HASTELLOY brand metal alloys are available in filter grade powders. The filtration media is then similarly formed using various costly and energy inefficient processing intensive metallurgical techniques.

In corrosive applications, refractory metals and their compounds such as titanium oxide or compounds such as silicon carbide are preferred as filter media due to their high corrosion resistance. However, most of these metals and compounds do not readily form alloys or homogeneous composites with other materials to result in an easily fabricated filter.

In high-heat applications, heat dissipation can be a problem. Therefore, in many processes where the filtrant is hot or in transpirational cooling, the porous metal material preferably has a high coefficient of thermal conductivity.

Another problem depending on the metals and fabrication techniques used is that many of the resultant filters can be exceedingly brittle. Further fabrication and machining to form complex shaped filtration media from such brittle stock is expensive and time consuming.

Lightweight filtration media are preferred for ease in handling, transport and in applications such as aerospace where low weight is preferred.

It would be advantageous therefore to have an economically produced lightweight material which is resistant to corrosives, has a porosity valuable for filtration, transpiration cooling, or tissue attachment and which is solid, machinable or otherwise readily formable into complex shapes and is heat-dissipating.

SUMMARY OF THE INVENTION

The principal and secondary objects of the invention are to provide a homogeneous sintered composite material which can be fabricated using a practical, simple and more energy efficient process.

It is another object of the invention to provide a process for more homogeneously sintering composite powder compacts having complex shapes.

It is another object of the invention to form heatsinks and other heat-dissipating elements of microcircuit devices, where the material is lightweight, homogeneous, of low porosity, highly thermally conductive, brazable, and can be formulated to exhibit a compatible coefficient of thermal expansion.

It is a further object of this invention to provide solid body fluid filtration media which is low-weight, not overly brittle, machinable, brazable, and of high porosity, and can be formulated to exhibit good corrosion resistance and high thermal conductivity.

It is a further object of this invention to provide a solid body porous metal material for use in transpiration cooled mechanisms.

It is a further object of this invention to provide a solid body porous metal material for use as a tissue attachable surgical implant.

It is a further object of this invention to provide an efficient process for the manufacture of one or more of the above items or materials.

These and other objects are achieved by press-forming a homogeneous mixture of powders of an agglutinating component, a second material component having a melting point higher than the agglutinating component, and an exothermically reactive substance component to form a compact; heating the compact, then inducing an exothermic reaction of the reactive substance which efficiently and controllably generates sufficient additional heat to melt the metal. This results in a more uniformly sintered, homogeneous distribution of the components throughout the structure.

For electronic heat-dissipation applications the agglutinating component is a high thermal conductivity metal such as copper, and the second higher melting point material component has low thermal expansivity and high thermal conductivity. To reduce porosity, the reacted compact is pressed again while the agglutinating component is still substantially in the liquid phase. For low weight applications the second material has high specific thermal conductivity.

For filtration media applications, the reacted compact is allowed to cool with or without pressing, leaving a porous final composite. For corrosion resistant media, the agglutinating component is a low refractory metal, and the second higher melting point material is a refractory metal oxide, carbide or boride.

The type and relative amounts of the component powders and their particle sizes, as well as certain processing parameters such as pressing force, temperature and time of exposure may be adjusted to optimize finished composite characteristics such as overall porosity, weight, strength, thermal conductivity and CTE.

DESCRIPTION OF THE PREFERRED EMBODIMENT OF THE INVENTION

A first embodiment of the claimed composite and process will be described in connection with the fabrication of heatsinks used in microelectronic devices. The same process may be used in making other articles of manufacture requiring homogeneously sintering a combination of powdered materials of different physical properties such as melting temperatures and/or specific gravities.

At this point it should be noted that although a low overall density of the composite is preferred for low weight applications such as aerospace systems, maintaining high theoretical density and low porosity of the composite is preferred to achieve maximum thermal conductivity.

In the heat-dissipating composite embodiment, the component powders are selected to enhance thermal conductivity, and thermal expansion compatibility. Low overall composite weight will of course be favored for low weight applications.

A mixture of particles of at least one agglutinating component preferably having an average thermal conductivity of at least about 200 W/m° K, at least one low thermal expansivity material component having a melting point higher than that of the agglutinating component, and an exothermically reactive substance component, is press-molded into compacts in the general shape of the desired heatsinks. Shaping is not so critical where a second pressing or other post-sintering machining is used. Although not absolutely necessary, a chemical binder may be added to the pre-pressed mixture to enhance compact strength to withstand rougher handling prior to sintering. Similarly, a lubricating material such a a metallic soap or wax may be added to the pre-pressed mixture to improve die wear.

The agglutinating component is preferably a metal, either as a single element or alloy that has an average thermal conductivity of at least about 200 W/m° K and therefore comprises elemental aluminum, copper, gold or silver. It is most preferably elemental copper due to its high thermal conductivity, moderate melting point, moderate weight and its moderate thermal expansivity.

The high melting point material component is preferably a material having a coefficient of thermal expansion of less than $7 \times 10-6/°$ C. and must have a melting point greater than that of the agglutinating component. Therefore, if the agglutinating component is copper, the low CTE material component will have a melting point greater than 1083° C. Although high melting point metals such as tungsten and molybdenum may be used, for low weight applications they are not preferred. Low weight materials such as silicon carbide having a specific gravity of 3.2 g/cc and a melting point of greater than 2500° C. are the preferred choice. Other candidates include various light-weight metal carbides, oxides and nitrides such as titanium oxide and boron carbide, oxide or nitride. As described below, these oxides may also fulfill part of the reactive substance component of the invention.

The reactive substance component must be selected to have reactants and reaction products which are compatible with the elements and compounds used in the other components. The substance must undergo a reaction which generates enough heat to raise the temperature of the compact beyond the melting point of the agglutinating component and not the high melting point component.

It should be noted that the temperature of the compact prior to reaction is selected within a range that allows the above limitations. This may require a separate heating step depending on the ambient temperature conditions. The preferred substance will also be of low specific gravity so that residual unreacted substance will not appreciably increase the overall weight of the finished composite.

The preferred exothermically reactive substance component will be capable of a redox reaction. The preferred reductant is aluminum due to its reaction product being alumina which is both light weight and in concentrations less than 20 wt. % will not adversely affect the composite during subsequent brazing.

The preferred oxidant is titanium oxide and/or boron oxide because these compounds are inexpensive and readily available.

These redox components allow the reaction to take place in air. It shall be clear to those skilled in the art that the atmosphere in which the reaction takes place may be selected to supply some of the oxidant, such as would be provided by an $O_2$ rich atmosphere, or even the reductant, however, this is not preferred.

The preferred mixture includes a lubricant such as stearic acid, zinc stearate, lithium stearate or a wax such as ACRA-WAX brand synthetic wax.

The component particles are formed by techniques well-known to those skilled in powder metallurgy. For metal as the agglutinating component, techniques such as chemical reduction or atomization may be used. Non-spherical particles obtained by a reduction or atomizing process such as the one disclosed in Wagner, et al., U.S. Pat. No. 3,128,172 in connection with copper powders are preferred in order to obtain a higher degree of friction between the particles and to increase the surface area of each particle so as to prevent segregation of the materials according to their respective densities.

Also, if possible, it is preferable to select particles within a narrow range of sizes and weights to enhance homogeneity.

Where component powders have particles of substantially different densities, it has been found that the homogeneity of the final composite may be improved by using a free-flowing powder mixture of pre-clustered particles of the different density component powders as disclosed in Polese et al., U.S. Pat. No. 5,413,751 incorporated herein by this reference. Pre-clustered mixtures may be obtained through other methods resulting in a temporary bond between particles of different densities.

Press molding is accomplished by a hydraulic press operating at room temperature using a pressure from 1,350 to 3,400 atmospheres (20,000 to 50,000 lbs. per square inch) to form the green compact. Preferably a lubricant such as a layer of graphite is applied to the die of the press prior to pressing.

The compact is then preheated, if necessary, by placement in a furnace or being subjected to an oxyacetylene flame. The temperature of the entire compact is preferably raised to a point where initiation of the exothermic reaction will cause consumption throughout the entire compact in chain-reaction fashion. Further, the temperature of the compact must be high enough to allow the additional heat provided by the reaction to melt the agglutinating component without melting the high melting point component.

The reaction is then initiated by a flame directed at a portion of the preheated compact. The reaction begins at the portion and since it is exothermic, spreads throughout the compact in a chain reaction fashion.

Since the reactive substance is distributed within the compact, heat is generated within the compact rather than from outside. In this way, the temperature of the entire composite is more easily controlled over time, resulting in a far more homogeneous composite. Indeed, far more complex composite shapes may now be sintered homogeneously since deeper areas are not insulated from the sintering heat.

The reaction of the reactive substance component will form reaction products which either vaporize off or otherwise reduce the overall volume previously filled by the substance, causing the formation of voids in the compact. In addition, the melted material will tend to wet the surface of the unmelted material enlargening the voids.

While the melted material remains substantially in the liquid phase, the reacted compact undergoes a second pressing to reduce its porosity.

The term "substantially" is used because minute amounts of the metal may have crossed out of the liquid phase, and indeed the central core of some larger particles may never have achieved the liquid phase, without unduly impacting on the ability to obtain a satisfactory final composite.

EXAMPLE 1

Powders were selected in the following approximate amounts:

4.7 kilograms copper having particle sizes averaging between about 10 and about 50 microns, as the agglutinating component;

1.1 kilograms silicon carbide having particle sizes averaging between about 30 and about 50 microns, as part of the high melting point material component;

3.3 kilograms titanium oxide having particle sizes averaging between about 20 and about 45 microns, 2.9 kilograms boron oxide having particle sizes averaging between about 20 and about 45 microns, as part of the high melting point material component and part of the exothermically reactive substance component;

3.8 kilograms aluminum having particle sizes averaging between about 30 and about 45 microns, as part of the exothermically reactive component; and 0.12 kilograms zinc stearate having particle sizes averaging between about 100 and about 300 microns, as a lubricating/binder component.

Such powders can be manufactured by techniques well known in the art of powder metallurgy.

The mixture was press-molded at room temperature under 3,000 atmospheres (44,000 lbs/in$^2$) into the final 3.0 cm×3.0 cm×0.5 cm shape of the desired heatsinks.

The resulting "green" compacts were placed in a heating furnace and subjected to a temperature of about 300 to about 400° C. for about 15 to about 30 minutes.

The warmed components were then exposed to a oxyacetylene flame which initiated an exothermic redox reaction between the aluminum, titanium oxide, and boron oxide. The reaction traveled across the entire compact in a chain reaction from the point of ignition, increasing the temperature to between about 1400 and about 1800° C. to melt the copper.

The reacted compact is then quickly form pressed a second time under about 5000 atmospheres (70,000 lbs./in$^2$) into a final net-shape of the desire heatsinks for microcircuit assemblies.

After cooling, the final articles exhibited a specific gravity of about 3.99 g/cc, as compared to the 4.2 g/cc that would result from a perfectly solid composite, and exhibited a porosity of less then about 5% which is equivalent to above 95% theoretical density.

Observation under 1,000×magnification of the products manufactured according to this example revealed a homogeneous and substantially uniform distribution of silicon carbide particles in a substantially fused aggregate of copper.

Other compositions with copper to silicon carbide weight ratios of about 3.0:1 through about 4.5:1 were similarly fabricated that exhibited coefficients of thermal expansion ranging from about 7.0×10$^{-6}$/° C. to about 10.0×10$^{-6}$/° C. sufficient to match the thermal expansion coefficient of gallium arsenide, $Al_2O_3$, and other materials used in the fabrication of microelectronic packages, while retaining coefficient of thermal conductivity between about 100 and about 150 W/m° K.

The ratios of the above components were selected to economically maximize the thermal conductivity and of the final composite while maintaining low weight and adequate thermal expansivity properties. However, it has been found that the following per total weight ranges of the above components will result in a final composite having a thermal conductivity of at least 110 W/m° K; a density of no greater than 4.0 grams/cm$^3$ and a thermal expansivity of no greater than 11.0×10$^{-6}$/° C.:

about 20 to about 50 wt. % copper;
about 5 to about 15 wt. % silicon carbide;
about 20 to about 25 wt. % titanium oxide;
about 15 to about 25 wt. % boron oxide; and
about 20 to about 30 wt. % aluminum,
with preferably about 0.5 to about 1.5 wt. % binder such as zinc stearate.

Overall density will fluctuate depending on processing inaccuracies, the presence of trace materials and various random distribution of the porosities.

In an alternate embodiment of the invention, the final composite characteristics such as weight, porosity, strength, thermal conductivity, expansivity and corrosion resistance are selected to enhance its use as filtration media. Optimizing one or more of these characteristics will guide the selection of the powder components. In general, such media will preferably be highly porous, and depending on the application, should be light-weight and resistant to corrosion by chemical agents. Although the thermal conductivity and thermal expansivity of the completed composite are less critical, highly thermally conductive components may be desirable in high heat filtration applications.

For corrosion resistant media the chemical components present in the composite are more refractory than the components described above for use in the heatsink embodiment.

In general, the fabrication of the composite proceeds similarly to the process steps in the heat-sink embodiment. A mixture of particles of at least one agglutinating component, at least one high melting point material component having a melting point higher than the agglutinating component, and an exothermically reactive substance component is press-molded into a compact in the shape of the desired solid body. Shaping is not so critical where significant post-sintering machining is intended. Adding a chemical binder to the pre-pressed mixture is usually not necessary since the overall density of the green compact is less and handling less rigorous. A lubricant may be added if high die wear is intolerable.

The agglutinating component is preferably a metal, either as a single element or alloy that is compatible with the other components of the mixture and final composite. Aluminum powder is a preferred choice because it is inexpensive, has a relatively low melting point and is highly reactive.

The high melting point material is preferably a low refractory material that is compatible with the other components of the mixture and final composite. As with the electronic heat sink embodiment silicon carbide is a preferred choice. Other candidates include various metal carbides, oxides and nitrides such as titanium oxide and boron oxide. These oxides may also fulfill part of the reactive substance component of the invention.

The compact is then preheated, if necessary, to a temperature which allow the chain reaction of the reacting of the exothermic substance and which allow the additional heat provided by the reaction to melt the agglutinating component without melting the high melting point component.

Alternately, the reaction may create a reaction product which is preferably melted by the heat generated by the reaction. This is particularly true in an example of the invention using aluminum as the agglutinating component and titanium oxide and boron oxide as both the high melting point material component and the reactive substance component. In this example a large amount of alumina is formed by the reaction. It is preferable that the exothermic reaction generate enough additional heat so as to melt the alumina.

The reaction is initiated by an oxyacetylene flame directed at an end portion of the preheated compact. The reaction begins at the portion and since it is exothermic, spreads throughout the compact in a chain reaction fashion.

Consumption of the reactive substance leaves voids in the compact resulting in a highly porous metal composite useful as a filter, or material for containing other filter material, a transpirational cooling material, or as a substrate for attaching tissue in surgical processes.

EXAMPLE 2

Powders were selected in the following approximate amounts:

About 1.1 kilograms silicon carbide having particle sizes averaging between about 20 and about 100 microns, as part of the high melting point material component;

About 3.3 kilograms titanium oxide having particle sizes averaging between about 20 and about 200 microns, and about 2.9 kilograms boron oxide having particle sizes averaging between about 20 and about 200 microns, as part of the high melting point material component and part of the exothermically reactive substance component; and About 3.8 kilograms aluminum having particle sizes averaging between about 20 and about 75 microns, as part of the exothermically reactive component.

Such powders can be manufactured by techniques well known in the art of powder metallurgy.

The mixture was press-molded at room temperature under about 3,000 atmospheres (44,000 lbs/in$^2$) into the final 3.0 cm×3.0 cm×0.5 cm shape of the desired filters.

The resulting "green" compacts were placed in a heating furnace and subjected to a temperature of about 300 to 400° C. for about 15 to 30 minutes.

The warmed components were then exposed to an oxyacetylene flame which initiates an exothermic redox reaction between the oxides and aluminum. The reaction travels across the entire compact in a chain reaction from the point of ignition, increasing the temperature to about 2200° C. exceeding the melting point of alumina.

The reacted compact is then form pressed a second time under about 500 to about 2000 atmospheres (7,000 to 30,000 lbs/in$^2$) depending on the application to attain the final desired porosity level.

After cooling, the final articles exhibited a specific gravity of about 3.0 g/cc, as compared to the 4.0 g/cc that would result from a perfectly solid composite with a porosity of less then 25% which is equivalent to 75% theoretical density.

Observation under 1,000×magnification of the products manufactured according to this example revealed a homogeneous and substantially uniform distribution of interconnected pores.

The ratios of the above components were selected to economically maximize low weight while maintaining an adequately rugged final composite and an adequate range of potential porosities. However, it has been found that the following per total weight ranges of the components will result in a final composite having a density of no greater than 3.2 grams/cm$^3$, a material strength of at least 250 MPa, and a porosity of between about 20% and about 30%:

about 5 to about 15 wt. % silicon carbide;
about 25 to about 35 wt. % titanium oxide;
about 20 to about 30 wt. % boron oxide; and
about 30 to about 35 wt. % aluminum.

Overall density will fluctuate depending on processing inaccuracies, the presence of trace materials and various random distribution of the porosities.

While the preferred embodiment of the invention has been described, modifications can be made and other embodiments may be devised without departing from the spirit of the invention and the scope of the appended claims.

What is claimed is:

1. A method for fabricating a substantially homogeneous composite comprises:

selecting a mixture of powdered particles of a first agglutinating material, a second material having a melting point greater than said first material, and an exothermically chemically reactive substance;

first pressing said mixture to form a compact; and initiating a reaction of said substance;

wherein said reaction raises the temperature of said compact sufficient to melt said first agglutinating material but insufficient to melt said second material.

2. The method of claim 1, wherein said initiating comprises first heating a portion of said compact to a temperature sufficient to initiate said reaction.

3. The method of claim 1, which further comprises preheating said compact prior to said initiating.

4. The method of claim 1, which further comprises:

second pressing said compact while a substantial portion of said first agglutinating material is in a liquid phase.

5. The method of claim 1, wherein said first agglutinating material is a metal having a thermal conductivity greater than 200 W/m° K, and said second material has a coefficient of thermal expansion of less than 7.0×10$^{-6}$/° C.

6. The method of claim 5, wherein said metal is selected from the group consisting of copper, aluminum, silver and mixtures thereof.

7. The method of claim 5, wherein said metal is copper.

8. The method of claim 1, wherein said second material is selected from the group consisting of silicon carbide, titanium oxide, boron oxide, and mixtures thereof.

9. The method of claim 1, wherein said substance comprises an oxidant and a reductant.

10. The method of claim 9, wherein said oxidant is selected from the group consisting of: titanium oxide, a boride, a carbide and a nitride; and wherein said reductant is selected from the group consisting of: aluminum, magnesium, titanium and mixtures thereof.

11. The method of claim 1, wherein:

said agglutinating material is between about 20 and about 50 percent per total composite weight elemental copper;

said second material is between about 5 and about 15 percent per total mixture weight silicon carbide; and said substance is between about 20 and about 25 percent per total mixture weight titanium oxide, between about 15 and about 25 percent per total mixture weight boron oxide, and between about 20 and about 30 percent per total mixture weight aluminum.

12. The method of claim 1, wherein:

said agglutinating material is about 29.5 percent per total composite weight copper;

said second material is about 7.0 percent per total composite weight silicon carbide; and said substance is about 20.7 percent per total composite weight titanium oxide, about 18.2 percent per total composite weight boron oxide, and about 23.9 percent per total composite weight aluminum.

13. The method of claim 1, wherein said mixture further comprises an amount of a chemical binder selected from the group consisting of zinc stearate, calcium stearate, lithium stearate, calcium oleate, stearic acid, synthetic waxes and mixtures thereof.

14. The method of claim 1, wherein said reaction raises temperature of said compact sufficient to melt a reaction product formed from said substance during said reaction.

15. A substantially homogeneous composite comprises:
substantially unfused particles of a compound interspersed within a matrix of agglutinating material;
wherein said material has a lower melting point than said compound;
wherein said composite has a density of less than 4.0 grams per cubic centimeter which is at least 95% of theoretical density; and
wherein said composite has a coefficient of thermal conductivity greater than 100 W/m° K; and wherein said composite has a coefficient of thermal expansion less than $10.0 \times 10^{-6}$/° C.

16. The composite of claim 15, which withstands brazing temperatures up to 830 degrees centigrade for about 30 minutes without blistering.

17. A substantially homogeneous powder metallurgical compact suitable for further fabrication into a homogeneous sintered composite comprises:
a concentration of a first metal;
a concentration of a second material a melting point greater than the melting point of said first metal; and
a concentration of an exothermically chemically reactive substance.

18. The compact of claim 17, wherein said metal having a thermal conductivity greater than 200 W/m° K, and said second material has a coefficient of thermal expansion of less than $10.0 \times 10^{-6}$/° C.

19. The compact of claim 17, wherein said substance comprises an oxidant and a reductant.

20. The compact of claim 17, wherein said concentration of a first metal is between about 20 and about 50 percent per total compact weight;
said concentration of a second material is between about 40 and about 65 percent per total compact weight; and
said concentration of an exothermically chemically reactive substance is between about 15 and about 25 percent per total compact weight.

* * * * *